United States Patent
Wang (10) Patent No.: US 11,631,685 B2
(45) Date of Patent: Apr. 18, 2023

(54) MEMORY DEVICE AND METHOD OF MANUFACTURING THE SAME

(71) Applicant: Winbond Electronics Corp., Taichung (TW)

(72) Inventor: Chung-Hsuan Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 17/412,291

(22) Filed: Aug. 26, 2021

(65) Prior Publication Data

US 2022/0320126 A1 Oct. 6, 2022

(30) Foreign Application Priority Data

Apr. 6, 2021 (TW) ................. 110112456

(51) Int. Cl.
*H01L 21/00* (2006.01)
*H01L 27/11531* (2017.01)
(Continued)

(52) U.S. Cl.
CPC .. *H01L 27/11531* (2013.01); *H01L 27/11521* (2013.01); *H01L 29/40114* (2019.08);
(Continued)

(58) Field of Classification Search
CPC ......... H01L 27/11531; H01L 29/40114; H01L 27/11521; H01L 29/42328; H01L 29/66825; H01L 29/7883
See application file for complete search history.

(56) References Cited

U.S. PATENT DOCUMENTS 5,498,560 A * 3/1996 Sharma ............. H01L 27/11521
438/593
9,997,524 B2 6/2018 Shih et al.
(Continued)

FOREIGN PATENT DOCUMENTS

TW I541886 7/2016
TW I548036 9/2016
(Continued)

OTHER PUBLICATIONS

Machine tranlsation of TW 1548036 or TW 201505128, 2022.*
"Office Action of Taiwan Counterpart Application", dated Dec. 6, 2021, p. 1-p. 4.

*Primary Examiner* — Richard A Booth
(74) *Attorney, Agent, or Firm* — JCIPRNET (57) ABSTRACT

Provided is a memory device including a substrate, a plurality of first stack structures, and a plurality of second stack structures. The substrate includes an array region and a periphery region. The first stack structures are disposed on the substrate in the array region. Each first stack structure sequentially includes: a first tunneling dielectric layer, a first floating gate, a first inter-gate dielectric layer, a first control gate, a first metal layer, a first cap layer, and the first stop layer. The second stack structures are disposed on the substrate in the periphery region. Each second stack structure sequentially includes: a second tunneling dielectric layer, a second floating gate, a second inter-gate dielectric layer, a second control gate, a second metal layer, a second cap layer, and the second stop layer. The first stack structures have a pattern density greater than a pattern density of the second stack structures.

8 Claims, 10 Drawing Sheets

(51) Int. Cl.
*H01L 27/11521* (2017.01)
*H01L 29/66* (2006.01)
*H01L 29/788* (2006.01)
*H01L 21/28* (2006.01)
*H01L 29/423* (2006.01)

(52) U.S. Cl.
CPC .. *H01L 29/42328* (2013.01); *H01L 29/66825* (2013.01); *H01L 29/7883* (2013.01)

(56) References Cited

U.S. PATENT DOCUMENTS

| | | | |
|---|---|---|---|
| 2010/0317195 | A1 | 12/2010 | Feng et al. |
| 2011/0303965 | A1 | 12/2011 | Kim et al. |
| 2014/0080278 | A1 | 3/2014 | Shin et al. |
| 2019/0348426 | A1* | 11/2019 | Cho ............ H01L 27/11531 |

FOREIGN PATENT DOCUMENTS

| | | |
|---|---|---|
| TW | 201906140 | 2/2019 |
| TW | I690059 | 4/2020 |

* cited by examiner

MEMORY DEVICE AND METHOD OF MANUFACTURING THE SAME

CROSS-REFERENCE TO RELATED APPLICATION

This application claims the priority benefit of Taiwan application serial no. 110112456, filed on Apr. 6, 2021. The entirety of the above-mentioned patent application is hereby incorporated by reference herein and made a part of this specification.

BACKGROUND OF THE INVENTION

Field of the Invention

The present invention relates to a semiconductor device and a method of manufacturing the same, and in particular to a memory device and a method of manufacturing the same.

Description of Related Art

With the progress of science and technology, all kinds of electronic products tend to be light, thin, and small. In this trend, a critical size of the memory device has also been gradually reduced, which has made the lithography process more and more difficult. In a conventional lithography process, the method of shrinking the critical size includes using higher numerical aperture (NA) optics, shorter exposure wavelengths (e.g., EUV), or using the immersion lithography technology. As the resolution of the conventional lithography process approaches the theoretical limit, the traditional lithography methods are no longer adequate. Double-patterning (DP) methods have begun to be used to overcome optical problems, thereby improving the resolution of memory devices.

However, in the current patterning method, due to the difference in pattern density between the peripheral region and the array region, the etching process will face the challenge of the loading effect, thereby causing the memory cells in the array region occurring the circuit short or gate short because of insufficient etching.

SUMMARY OF THE INVENTION

The invention provides a method of manufacturing a memory device including: providing a substrate, wherein the substrate comprises an array region and a periphery region; sequentially forming a stack layer, a control structure, a hard mask layer, and a mask pattern on the substrate, wherein the control structure at least comprises a first stop layer, a first oxide layer, a second stop layer, and a second oxide layer; forming a photoresist layer in the mask pattern of the periphery region; by using the photoresist layer and the mask pattern as a mask, removing a portion of the hard mask layer, a portion of the second oxide layer, and a portion of the second stop layer in the array region to form a plurality of first openings in the array region; after removing the photoresist layer, removing a portion of the hard mask layer in the periphery region to form at least one second opening in the periphery region; performing a first etching process to remove a portion of the control structure so that the plurality of first openings and the second opening extend into the control structure, thereby forming a plurality of third openings and at least one fourth opening, wherein the fourth opening has a bottom surface higher than a bottom surface of the plurality of third openings; and performing a second etching process to remove a portion of the stack layer so that the plurality of third openings and the fourth opening extend into the stack layer, thereby forming a plurality of fifth openings and at least one sixth opening.

The invention provides a memory device including a substrate, a plurality of first stack structures, and a plurality of second stack structures. The substrate includes an array region and a periphery region. The first stack structures are disposed on the substrate in the array region. Each first stack structure sequentially includes: a first tunneling dielectric layer, a first floating gate, a first inter-gate dielectric layer, a first control gate, a first metal layer, a first cap layer, and the first stop layer. The second stack structures are disposed on the substrate in the periphery region. Each second stack structure sequentially includes: a second tunneling dielectric layer, a second floating gate, a second inter-gate dielectric layer, a second control gate, a second metal layer, a second cap layer, and the second stop layer.

The invention provides a patterning method including: sequentially forming a control structure, a hard mask layer, and a mask pattern on a target layer, wherein the control structure comprises a plurality of stop layers and a plurality of oxide layers stacked alternately; forming a photoresist layer in the mask pattern on the hard mask layer; by using the photoresist layer and the mask pattern as a mask, removing a portion of the hard mask layer and a portion of the control structure to form a plurality of first openings; removing the photoresist layer and the hard mask layer there-below to form at least one second opening, wherein the second opening has a bottom surface higher than a bottom surface of the plurality of first openings; and performing one or more etching processes so that the plurality of first openings and the second opening extend into the control structure and the target layer, thereby dividing the target layer and the control structure into a plurality of stack structures.

Based on above, a control structure may be formed between the target layer and the hard mask layer. This control structure includes a plurality of stop layers and a plurality of oxide layers stacked alternately, so as to control the etching rate of the array region and the peripheral region, thereby effectively reducing the loading effect of the etching process and avoiding the short issue of the adjacent floating gates in the array region. The short issue is caused by the incomplete etching, thereby resulting in the floating gates not being completely isolated from each other. In this case, the target layer in the array region and the peripheral region is patterned at the same time, and then a plurality of stack structures with different pattern densities are formed in the array region and the peripheral region.

DESCRIPTION OF THE EMBODIMENTS

Figure 2:
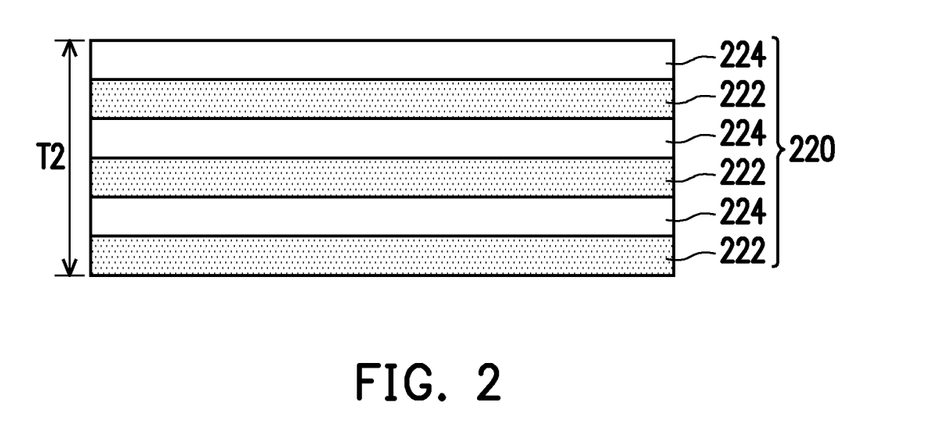
FIG. 2 and FIG. 3 are schematic cross-sectional view of a control structure according to different embodiments of the present invention.
Figure 3:
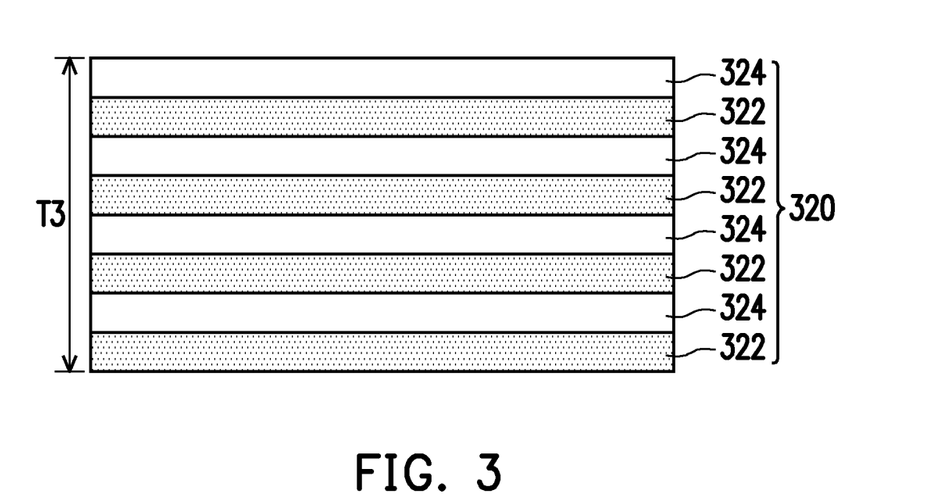

FIG. 1A to FIG. 1H are schematic cross-sectional views illustrating a manufacturing process of a memory device according to an embodiment of the present invention. FIG. 2 and FIG. 3 are schematic cross-sectional view of a control structure according to different embodiments of the present invention.

Figure 1A:
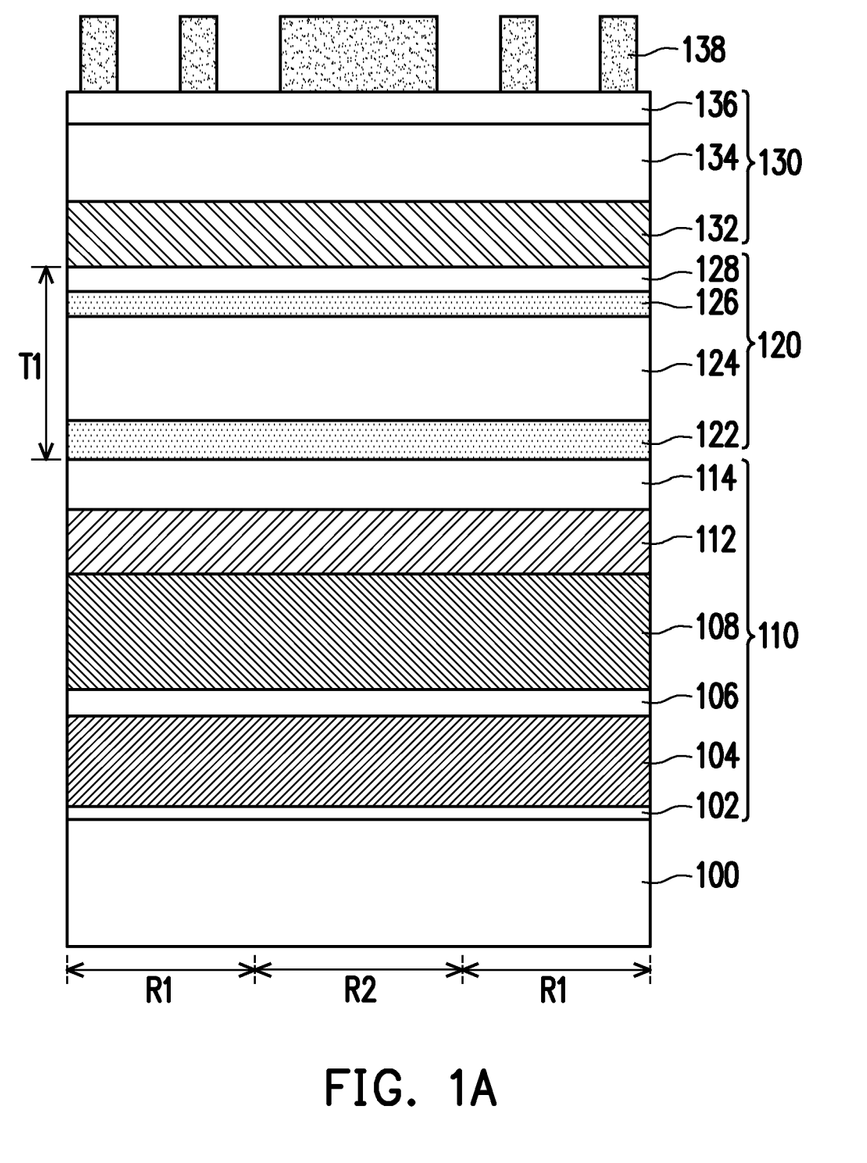
FIG. 1A to FIG. 1H are schematic cross-sectional views illustrating a manufacturing process of a memory device according to an embodiment of the present invention.

Referring to FIG. 1A, a method of manufacturing a memory device is provides to include the following steps. First, a substrate 100 is provided. The substrate 100 may include an array region R1 and a peripheral region R2, the array region R1 may be a memory array region with one or more memory cells, and the peripheral region R2 may be a peripheral circuit region with one or more select gates.

Next, a stack layer 110 (also referred to as a target layer) is formed on the substrate 100. Specifically, as shown in FIG. 1A, the stack layer 110 includes a tunneling dielectric layer 102, a floating gate 104, an inter-gate dielectric layer 106, a control gate 108, a metal layer 112, and a cap layer 114 in order from bottom to top.

A material of the tunneling dielectric layer 102 may be, for example, silicon oxide, a material of the floating gate 104 may include a conductive material, such as doped polysilicon, undoped polysilicon, or a combination thereof, the inter-gate dielectric layer 106 may be, for example, a composite layer composed of nitride/oxide/nitride/oxide/nitride (NONON), but the present invention is not limited thereto. In other embodiments, the composite layer may be three layers, five layers or more layers. In an embodiment, a material of the control gate 108 may include a conductive material, such as doped polysilicon, undoped polysilicon, or a combination thereof, a material of the metal layer 112 may be, for example, W, Co, Ni, or a combination thereof, a material of the cap layer 114 may include a dielectric material, such as silicon nitride, silicon oxynitride, or a combination thereof.

Thereafter, a control structure 120 is formed on the stack layer 110. Specifically, as shown in FIG. 1A, the control structure 120 includes a first stop layer 122, a first oxide layer 124, a second stop layer 126, and a second oxide layer 128 in order from bottom to top, the first stop layer 122 and the second stop layer 126 may have the same dielectric material, the first oxide layer 124 and the second oxide layer 128 may have the same material, such as silicon oxide, the material of the first stop layer 122 and the second stop layer 126 are different from the material of the first oxide layer 124 and the second oxide layer 128. For example, the first stop layer 122 and the second stop layer 126 may be silicon nitride layers, and the first oxide layer 124 and the second oxide layer 128 may be silicon oxide layers. In alternative embodiments, the first and second stop layers 122, 126 and the first and second oxide layers 124, 128 may have dielectric materials with different etching selectivities. In addition, the first oxide layer 124 may have a thickness greater than a thickness of the second oxide layer 128, and the first stop layer 122 may have a thickness greater than a thickness of the second stop layer 126. However, the present invention is not limited thereto.

Although the control structure 120 shown in FIG. 1A includes two stop layers and two oxide layers, the present invention is not limited thereto, the control structure 120 may include a plurality of stop layers and a plurality of oxide layers stacked alternately. Specifically, as shown in FIG. 2, the control structure 220 may include three stop layers 222 and three oxide layers 224 stacked on each other, as shown in FIG. 3, the control structure 320 may include four stop layers 322 and four oxide layers 324 stacked on each other. In other words, the number of stop layers and oxide layers may be adjusted according to requirements, and the present invention is not limited thereto, a thickness T1 of the control structure 120 may be substantially greater than or less than or equal to a thickness T2 of the control structure 220; and the thickness T2 of the control structure 220 may be substantially greater than or less than or equal to a thickness T3 of the control structure 320. However, the present invention is not limited thereto. In addition, as shown in FIG. 2 and FIG. 3, the stop layers 222 and 322 may have the same thickness; and the oxide layers 224 and 324 may also have the same thickness. However, the present invention is not limited thereto, in other embodiments, the stop layers 222 and 322 may have different thicknesses; and the oxide layers 224 and 324 may also have different thicknesses.

Referring back to FIG. 1A, after the control structure 120 is formed, a hard mask stack 130 is formed on the control structure 120. Specifically, as shown in FIG. 1A, the hard mask stack 130 includes a hard mask layer 132, a carbide layer 134, and an anti-reflective layer 136 in order from bottom to top, a material of the hard mask layer 132 may be polysilicon, a material of the carbide layer 134 may be spin-on-carbon (SoC), a material of the anti-reflective layer 136 may be silicon oxynitride.

Afterward, a photoresist pattern 138 is formed on the hard mask stack 130.

Figure 1B:
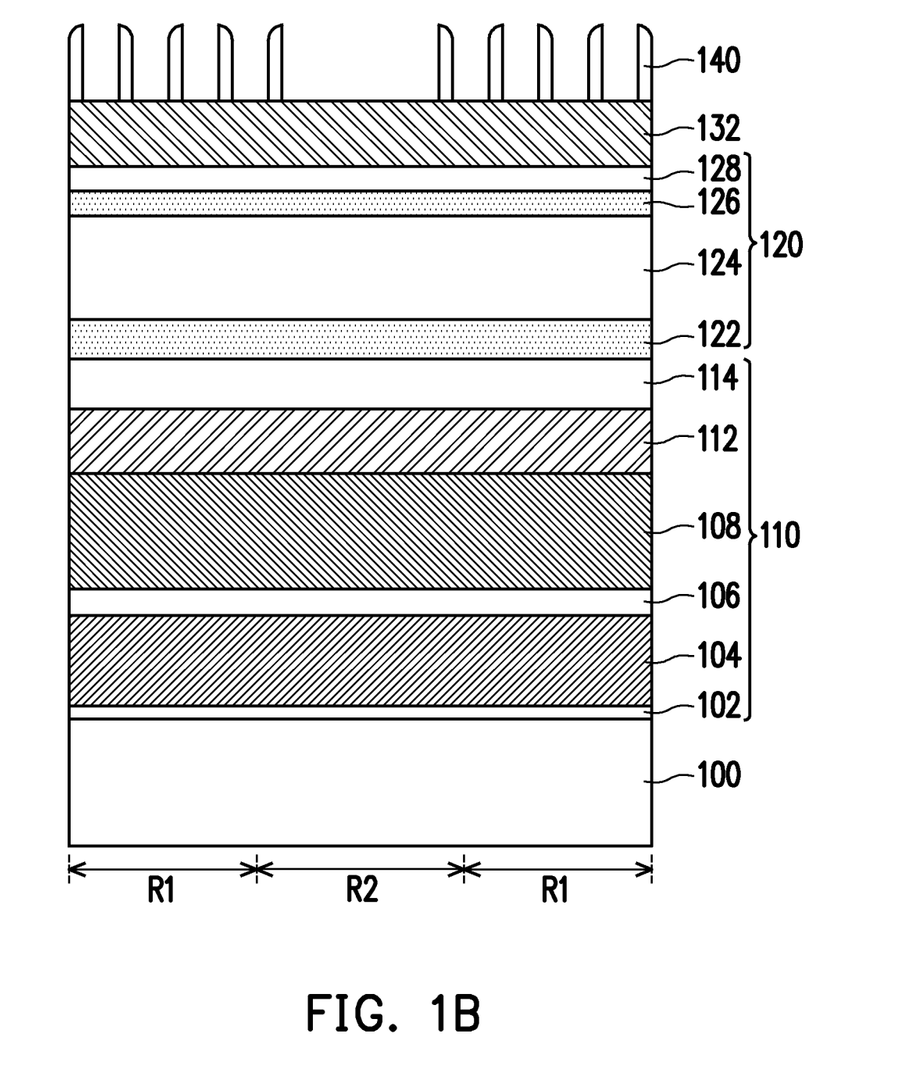

Referring to FIG. 1B, a self-aligning double patterning (SADP) process is performed to form a mask pattern 140 on the hard mask layer 132. In detail, the anti-reflective layer 136 and the carbide layer 134 are patterned by using the photoresist pattern 138. Thereafter, a mask layer is deposited on sidewalls of the patterned anti-reflective layer 136 and sidewalls of the patterned carbide layer 134, and then etched back to stop on the anti-reflective layer 136 or the carbide layer 134 to form the mask pattern 140, in which the mask pattern 140 is formed on the said sidewalls in the form of a spacer. Then, the patterned reflective layer 136 and the patterned carbide layer 134 are removed. In alternative embodiments, a self-aligning quadruple patterning (SAQP) process may also be performed to form the mask pattern 140 with a higher pattern density on the hard mask layer 132.

Figure 1C:
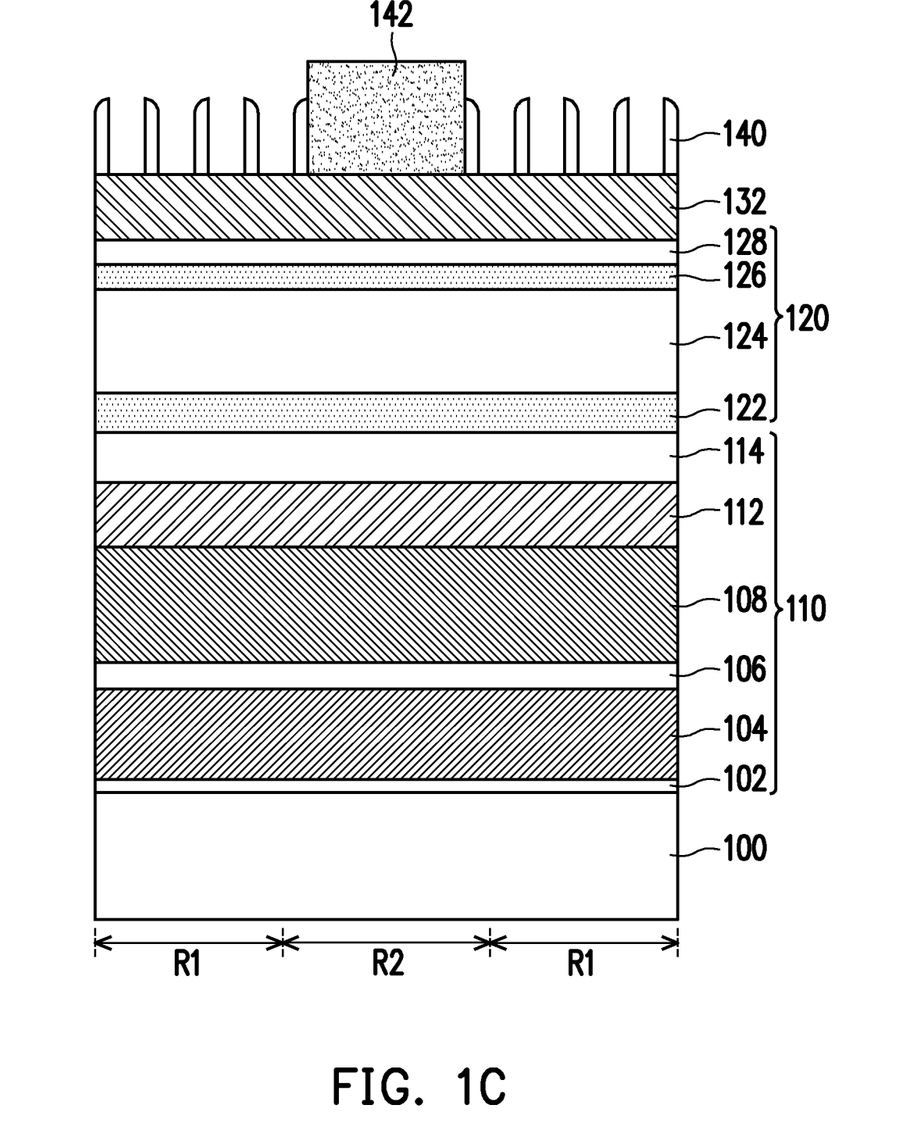

Referring to FIG. 1C, a photoresist layer 142 is formed in the mask pattern 140 of the peripheral region R2.

Figure 1D:
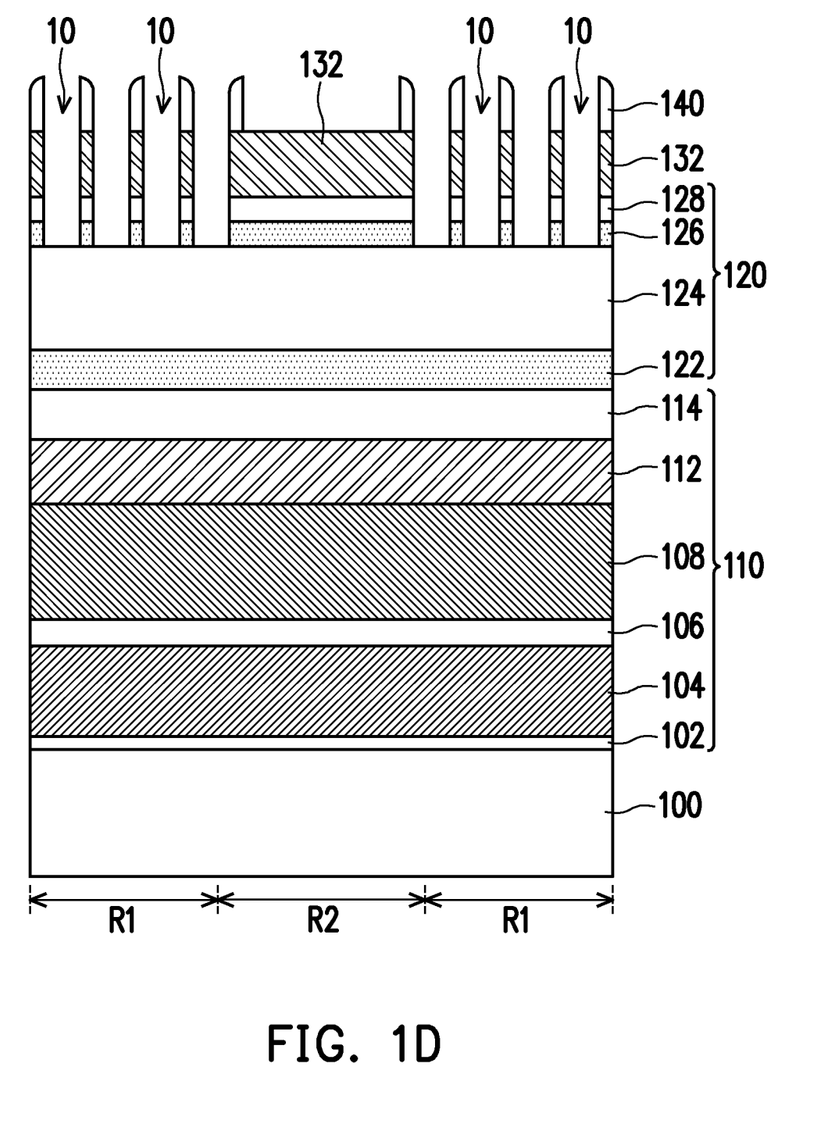

Referring to FIG. 1C and FIG. 1D, by using the photoresist layer 142 and the mask pattern 140 as a mask, a portion of the hard mask layer 132, a portion of the second oxide layer 128 and a portion of the second stop layer 126 in the array region R1 are removed, thereby forming a plurality of first openings 10 in the array region R1. Afterward, the photoresist layer 142 is removed to expose the hard mask layer 132 in the peripheral region R2.

Figure 1E:
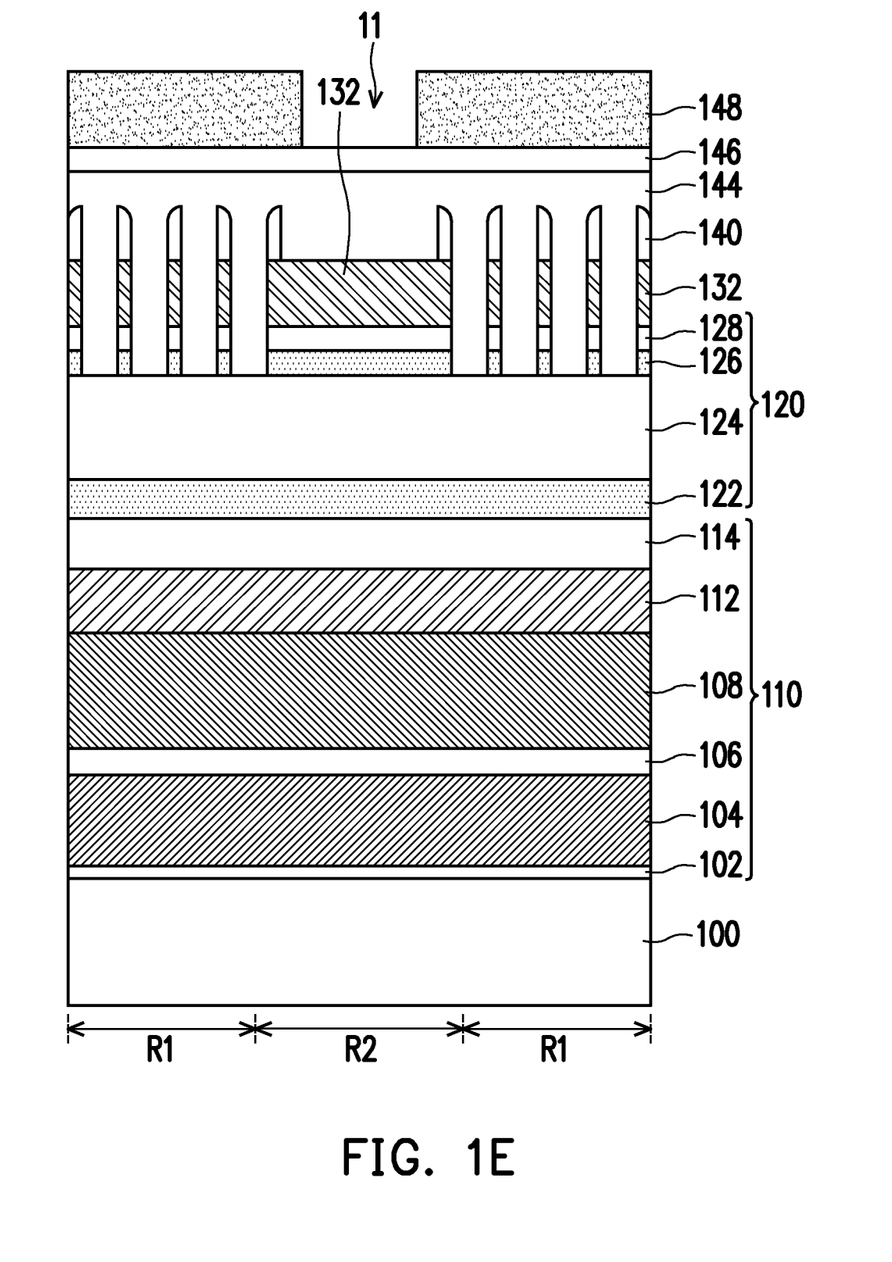

Referring to FIG. 1E, a dielectric layer 144, an anti-reflective layer 146, and a photoresist pattern 148 are sequentially formed on the substrate 100. The photoresist pattern 148 has at least one opening 11 to correspond to the hard mask layer 132 in the peripheral region R2.

Figure 1F:
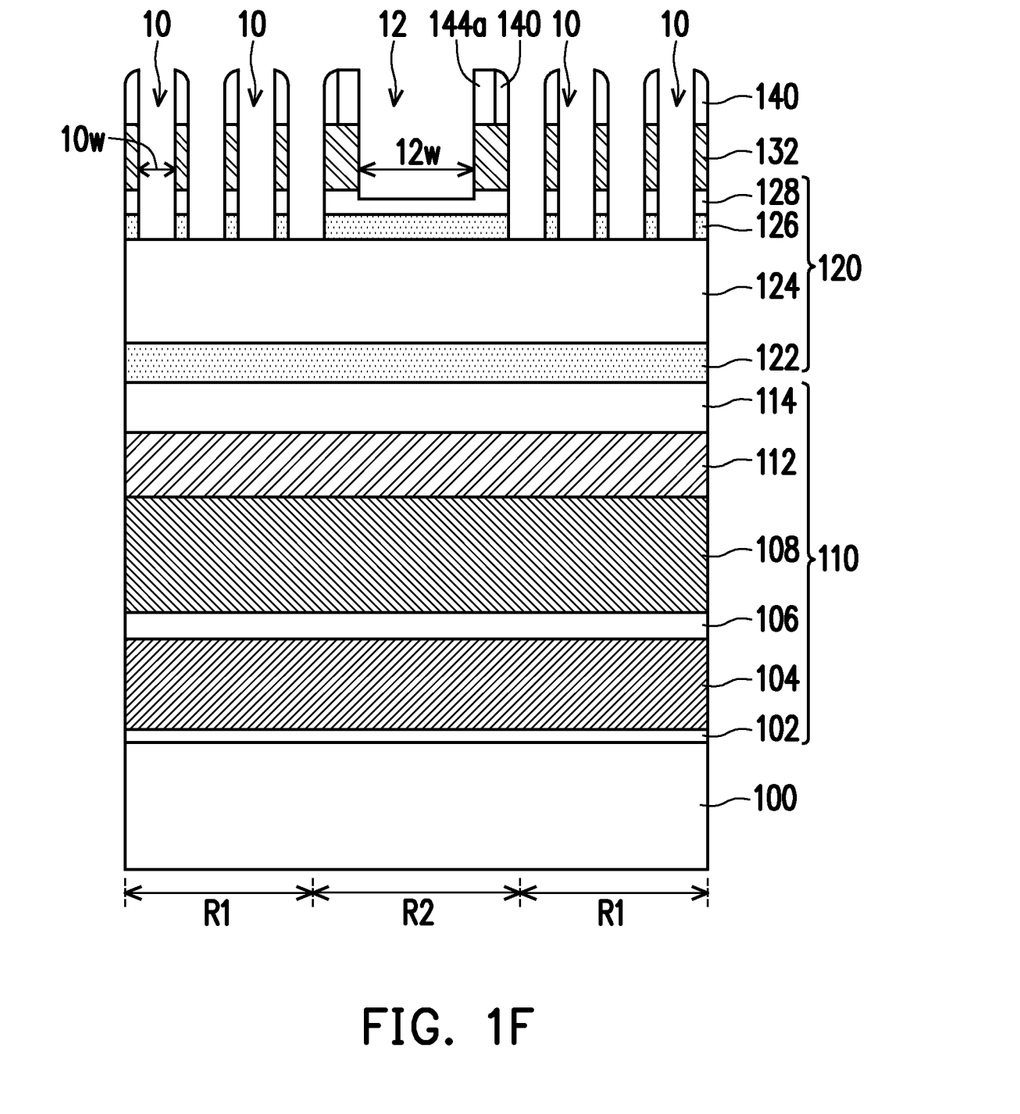

Referring to FIG. 1E and FIG. 1F, by using the photoresist pattern 148 as a mask, a portion of the anti-reflective layer 146, a portion of the dielectric layer 144, and a portion of the hard mask layer 132 in the peripheral region R2 are removed to form at least one second opening 12 in the peripheral region R2. Then, the remaining dielectric layer 144, the anti-reflective layer 146, and the photoresist pattern 148 are removed. After the removal, a portion of the dielectric layer 144a is disposed beside the mask pattern 140 in the peripheral region R2 to surround the second opening 12, as shown in FIG. 1F.

It should be noted that the second opening 12 stops on the control structure 120 in the peripheral region R2, and exposes the top surface of the second oxide layer 128 in the peripheral region R2. The first openings 10 expose the top surface of the first oxide layer 124 in the array region R1. In other words, the bottom surface of the first openings 10 may be lower than the bottom surface of the second opening 12, as shown in FIG. 1F, a width 10w of the first openings 10 may be less than a width 12w of the second opening 12.

Figure 1G:
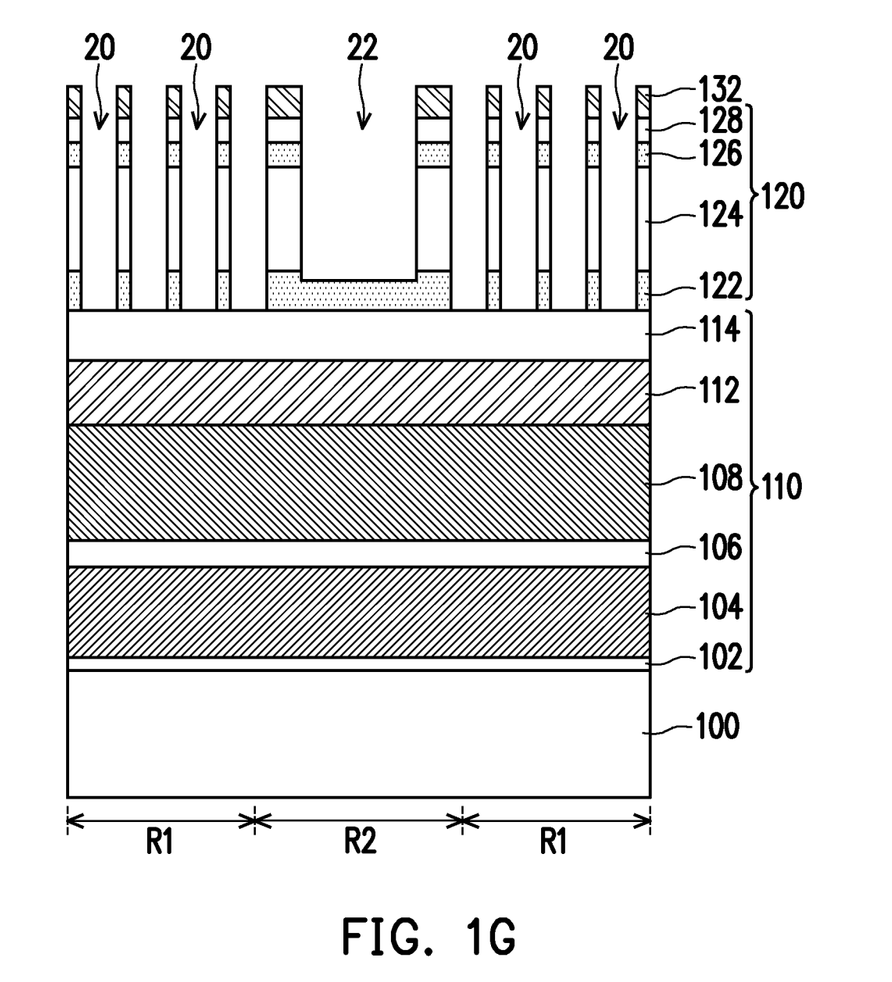

Referring to FIG. 1F and FIG. 1G, a first etching process is performed to remove a portion of the control structure 120 to extend the first openings 10 and the second opening 12 into the control structure 120, thereby forming a plurality of third openings 20 and at least one fourth opening 22. After performing the first etching process, as shown in FIG. 1G, the fourth opening 22 stops on the first stop layer 122 in the peripheral region R2 (or exposes the top surface of the first stop layer 122 in the peripheral region R2), while the third openings 20 stop on the stack layer 110 in the array region R1 (or expose the top surface of the stack layer 110 in the array region R1). In other words, a bottom surface of the third openings 20 may be lower than a bottom surface of the fourth opening 22.

It should be noted that since the opening density of the peripheral region R2 is greater than the opening density of the array region R1, the removal rate of the control structure 120 in the peripheral region R2 will be greater than the removal rate of the control structure 120 in the array region R1. In this case, the removal rate of the control structure 120 in the array region R1 and in the peripheral region R2 can be adjusted through at least two stop layers 122 and 126, so as to prevent the depth of the fourth opening 22 from being deeper than that of the third openings 20.

Figure 1H:
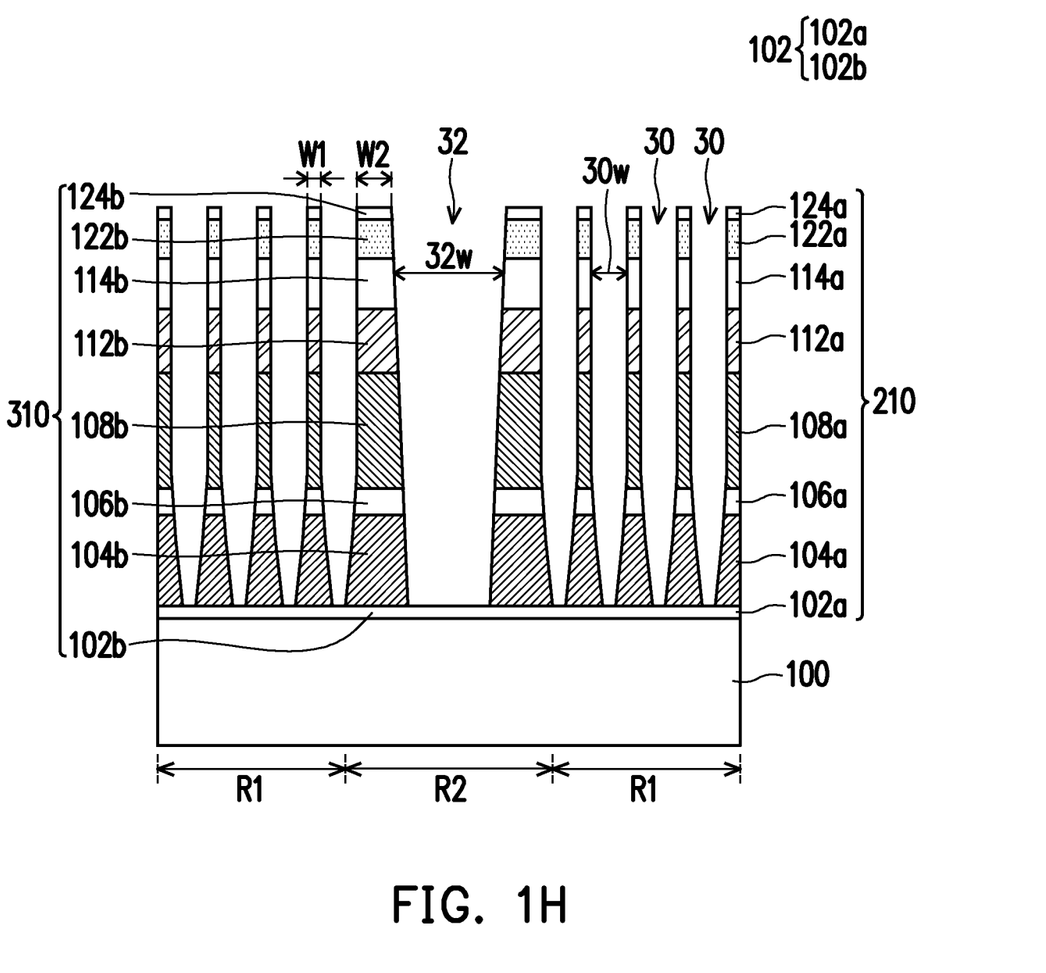

Referring to FIG. 1G and FIG. 1H, a second etching process is performed to remove a portion of the stack layer 110 to extend the third openings 20 and the fourth opening 22 into the stack layer 110, thereby forming a plurality of fifth openings 30 and at least one sixth opening 32. After performing the second etching process, as shown in FIG. 1H, the fifth openings 30 and the sixth opening 32 both stop on the tunneling dielectric layer 102 (or expose the top surface of the tunneling dielectric layer 102) to divide the stack layer 110 into a plurality of first stack structures 210 and a plurality of second stack structures 310.

It should be noted that, the removal rate of the stack layer 110 in the array region R1 and in the peripheral region R2 may be adjusted through at least two stop layers 122 and 126 in the control structure 120, so that the fifth openings 30 and the sixth opening 32 may be stop on the tunneling dielectric layer 102 simultaneously. In other words, by the control structure 120 with at least two stop layers, the present embodiment can effectively reduce the loading effect of the etching process, and avoid the floating gate 104 in the array region R1 being etched incompletely, thereby avoiding the short issue between the floating gates resulting from the floating gates 104a at both sides of the fifth opening 30 not isolated completely. In this case, as shown in FIG. 1H, the bottom surface of the fifth openings 30 may be regarded as flush with the bottom surface of the sixth opening 32.

As shown in FIG. 1H, the first stack structures 210 are disposed on the substrate 100 in the array region R1. Specifically, each first stack structure 210 may sequentially include: a tunneling dielectric layer 102a, a floating gate 104a, an inter-gate dielectric layer 106a, a control gate 108a, a metal layer 112a, a cap layer 114a, a stop layer 122a, and an oxide layer 124a. In addition, the second stack structures 310 are disposed on the substrate 100 in the peripheral region R2. Each second stack structure 310 may sequentially include: a tunneling dielectric layer 102b, a floating gate 104b, an inter-gate dielectric layer 106b, a control gate 108b, a metal layer 112b, a cap layer 114b, a stop layer 122b, and an oxide layer 124b. A tunneling dielectric layer 102a is connected to a tunneling dielectric layer 102b to form a continuous tunneling dielectric structure 102.

The first stack structures 210 has a pattern density greater than a pattern density of the second stack structures 310. In this case, a width W1 of each first stack structure 210 may be less than a width W2 of the second stack structure 310. In other words, an aspect ratio of each first stack structure 210 may be greater than an aspect ratio of each second stack structure 310. Since the first stack structures 210 have a higher aspect ratio, each first stack structure 210 has a shape or profile with a wider lower portion and a narrower upper portion, and each fifth opening 30 has a shape or profile with a narrower lower portion and a wider upper portion. Similarly, each second stack structure 310 may also have a shape or profile with a wider lower portion and a narrower upper portion, and the sixth opening 32 has a shape or profile with a narrower lower portion and a wider upper portion. In addition, a width 30w of the fifth openings 30 may be less than a width 32w of the sixth opening 32.

The first stack structures 210 may be storage units with flash memory; and the second stack structures 310 may be control units with select gates.

Although the said embodiment illustrates a series of patterning steps with flash memory and select gate electrodes as examples, the invention is not limited thereto. In other embodiments, the patterning steps may also be used to form contacts, active areas (AA) of dynamic random-access memory (DRAM), or similar target layers/films.

Figure 4:
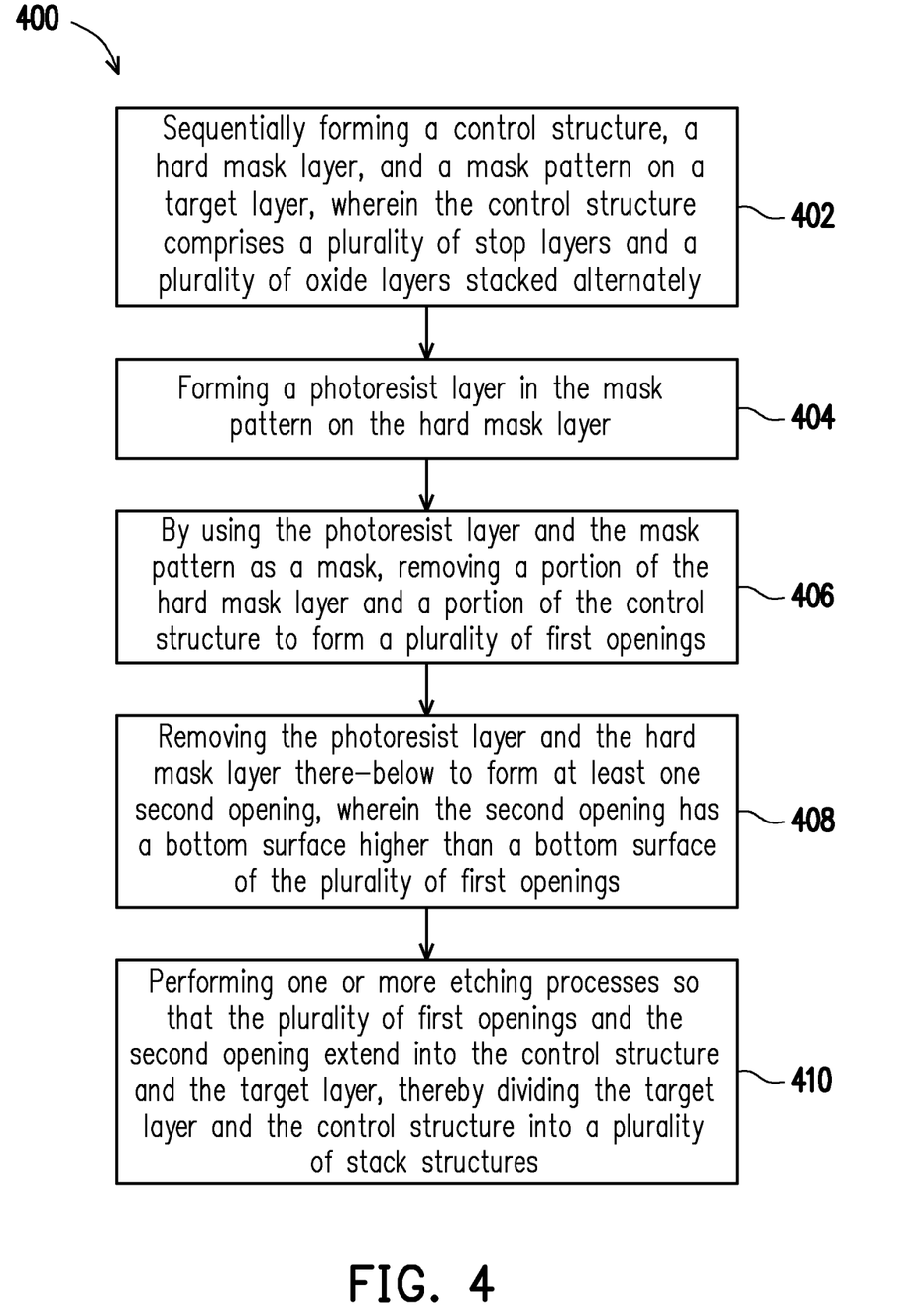
FIG. 4 is a flowchart illustrating a patterning method according to an embodiment of the present invention.

FIG. 4 illustrates a flowchart 400 of a patterning method according to an embodiment of the present invention. At step 402, a control structure, a hard mask layer, and a mask pattern are sequentially formed on the target layer, the said target layer includes a single-layered structure, a bi-layered structure, or a multi-layered structure. The control structure includes a plurality of stop layers and a plurality of oxide layers stacked alternately. FIG. 1A to FIG. 1B show schematic cross-sectional views corresponding to the step 402.

At step 404, a photoresist layer is formed in the mask pattern on the hard mask layer. FIG. 1C illustrates a schematic cross-sectional view corresponding to the step 404.

At step 406, by using the photoresist layer and the mask pattern as a mask, a portion of the hard mask layer and a portion of the control structure are removed, thereby forming a plurality of first openings. FIG. 1D illustrates a schematic cross-sectional view corresponding to the step 406.

At step 408, the photoresist layer and the hard mask layer there-below are removed to form at least one second opening, a bottom surface of the second opening is higher than a bottom surface of the first openings, and a width of the first openings is less than the width of the second opening. FIG. 1E to FIG. 1F illustrate schematic cross-sectional views corresponding to the step 408.

At step 410, one or more etching processes are performed to extend the first openings and second opening into the control structure and the target layer, thereby dividing the target layer and the control structure into a plurality of stack structures. FIG. 1G to FIG. 1H illustrate schematic cross-sectional views corresponding to the step 410.

In summary, in the present embodiment of the invention, a control structure may be formed between the target layer and the hard mask layer. This control structure may include a plurality of stop layers and a plurality of oxide layers stacked alternately, so as to control the etching rate of the array region and the peripheral region, thereby effectively reducing the loading effect of the etching process and avoiding the gate short issue resulting from the floating gate in the array region not being cut off. In this case, the target layer in the array region and the peripheral region are patterned simultaneously, and then a plurality of stack structures with different pattern densities are formed in the array region and the peripheral region.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A memory device, comprising:
   a substrate comprising an array region and a periphery region adjacent to the array region;
   a plurality of first stack structures disposed on the substrate in the array region, wherein each first stack structure sequentially includes: a first tunneling dielectric layer, a first floating gate, a first inter-gate dielectric layer, a first control gate, a first metal layer, a first cap layer, and a first stop layer, wherein the first tunneling dielectric layers are connected to each other to form a first continuous tunneling dielectric layer; and
   a plurality of second stack structures disposed on the substrate in the periphery region, wherein each second stack structure sequentially includes: a second tunneling dielectric layer, a second floating gate, a second inter-gate dielectric layer, a second control gate, a second metal layer, a second cap layer, and a second stop layer, wherein the second tunneling dielectric layers are connected to each other to form a second continuous tunneling dielectric layer, and
   the first continuous tunneling dielectric layer is connected to the second continuous tunneling dielectric layer to form a continuous tunneling dielectric structure.

2. The memory device according to claim 1, wherein the plurality of first stack structures have a pattern density greater than a pattern density of the plurality of second stack structures.

3. The memory device according to claim 1, wherein the plurality of second stack structures comprise a select gate.

4. The memory device according to claim 1, wherein the first stop layers of the two adjacent first stack structures are physically separated from each other and are not connected with each other.

5. The memory device according to claim 4, wherein the second stop layers of the two adjacent second stack structures are physically separated from each other and are not connected with each other.

6. The memory device according to claim 5, wherein spacings that separate the first stop layers of the two adjacent first stack structures are less than spacings that separate the second stop layers of the two adjacent first stack structures.

7. The memory device according to claim 2, wherein a width of each first stack structure is less than a width of the second stack structure.

8. The memory device according to claim 7, an aspect ratio of each first stack structure is greater than an aspect ratio of each second stack structure.

* * * * *